US008017182B2

(12) United States Patent
Hendriks et al.

(10) Patent No.: US 8,017,182 B2
(45) Date of Patent: Sep. 13, 2011

(54) METHOD FOR DEPOSITING THIN FILMS BY MIXED PULSED CVD AND ALD

(75) Inventors: Menso Hendriks, Soest (NL); Martin Knapp, Laufen (DE); Suvi Haukka, Helsinki (FI)

(73) Assignee: ASM International N.V. (NL)

(*) Notice: Subject to any disclaimer, the term of this patent is extended or adjusted under 35 U.S.C. 154(b) by 738 days.

(21) Appl. No.: 11/766,625

(22) Filed: Jun. 21, 2007

(65) Prior Publication Data

US 2008/0317972 A1    Dec. 25, 2008

(51) Int. Cl.
*C23C 16/22* (2006.01)

(52) U.S. Cl. .......... 427/248.1; 427/255.31; 427/255.32; 427/255.394; 427/255.7

(58) Field of Classification Search ............... 427/248.1, 427/255.31, 255.32, 255.7, 255.394; 117/84, 117/88
See application file for complete search history.

(56) References Cited

U.S. PATENT DOCUMENTS

| | | |
|---|---|---|
| 4,058,430 A | 11/1977 | Suntola et al. |
| 4,927,670 A | 5/1990 | Erbil |
| 5,208,069 A | 5/1993 | Clark et al. |
| 5,246,881 A | 9/1993 | Sandhu et al. |
| 5,279,857 A | 1/1994 | Eichman et al. |
| 5,342,652 A | 8/1994 | Foster et al. |
| 5,595,784 A | 1/1997 | Kaim et al. |
| 5,691,235 A | 11/1997 | Meikle et al. |
| 5,711,811 A | 1/1998 | Suntola et al. |
| 5,723,384 A | 3/1998 | Park et al. |
| 5,916,365 A | 6/1999 | Sherman |

(Continued)

FOREIGN PATENT DOCUMENTS

EP    0 899 779    3/1999

(Continued)

OTHER PUBLICATIONS

Kim, Jin-Hyock, et al., "Film growth model of atomic layer deposition for multicomponent thin films". Journal of Applied Physics 97, 093505-1 to 093505-5 (2005).*

(Continued)

*Primary Examiner* — Bret Chen
(74) *Attorney, Agent, or Firm* — Knobbe, Martens, Olson & Bear, LLP

(57) ABSTRACT

Films are deposited on a substrate by a process in which atomic layer deposition (ALD) is used to deposit one layer of the film and pulsed chemical vapor deposition (CVD) is used to deposit another layer of the film. During the ALD part of the process, a layer is formed by flowing sequential and alternating pulses of mutually reactive reactants that deposit self-limitingly on a substrate. During the pulsed CVD part of the process, another layer is deposited by flowing two CVD reactants into a reaction chamber, with at least a first of the CVD reactants flowed into the reaction chamber in pulses, with those pulses overlapping at least partially with the flow of a second of the CVD reactants. The ALD and CVD parts of the process ca be used to deposit layers with different compositions, thereby forming, e.g., nanolaminate films. Preferably, high quality layers are formed by flowing the second CVD reactant into the reaction chamber for a longer total duration than the first CVD reactant. In some embodiments, the pulses of the third reactant at separated by a duration at least about 1.75 times the length of the pulse. Preferably, less than about 8 monolayers of material are deposited per pulse of the first CVD reactant.

40 Claims, 6 Drawing Sheets

U.S. PATENT DOCUMENTS

| | | | |
|---|---|---|---|
| 6,015,590 | A | 1/2000 | Suntola et al. |
| 6,087,257 | A | 7/2000 | Park et al. |
| 6,203,613 | B1 | 3/2001 | Gates et al. |
| 6,284,646 | B1 | 9/2001 | Leem |
| 6,287,965 | B1 | 9/2001 | Kang et al. |
| 6,342,277 | B1 | 1/2002 | Sherman |
| 6,355,561 | B1 | 3/2002 | Sandhu et al. |
| 6,416,577 | B1 | 7/2002 | Suntoloa et al. |
| 6,451,119 | B2 * | 9/2002 | Sneh et al. ............. 118/715 |
| 6,451,695 | B2 | 9/2002 | Sneh |
| 6,482,262 | B1 | 11/2002 | Elers et al. |
| 6,482,733 | B2 | 11/2002 | Raaijmakers et al. |
| 6,534,395 | B2 | 3/2003 | Werkhoven et al. |
| 6,599,572 | B2 | 7/2003 | Saanila et al. |
| 6,632,279 | B1 | 10/2003 | Ritala et al. |
| 6,638,879 | B2 * | 10/2003 | Hsieh et al. .............. 438/791 |
| 6,686,271 | B2 | 2/2004 | Raaijmakers et al. |
| 6,699,783 | B2 | 3/2004 | Raaijmakers et al. |
| 6,706,115 | B2 | 3/2004 | Leskela et al. |
| 6,727,169 | B1 | 4/2004 | Raaijmakers et al. |
| 6,759,325 | B2 | 7/2004 | Raaijmakers et al. |
| 6,780,704 | B1 | 8/2004 | Raaijmakers et al. |
| 6,800,552 | B2 | 10/2004 | Elers et al. |
| 6,800,567 | B2 * | 10/2004 | Cho ..................... 438/763 |
| 6,821,825 | B2 | 11/2004 | Todd et al. |
| 6,858,524 | B2 | 2/2005 | Haukka et al. |
| 6,867,152 | B1 | 3/2005 | Hausmann et al. |
| 6,869,876 | B2 | 3/2005 | Norman et al. |
| 6,881,636 | B2 * | 4/2005 | Weimer et al. ............. 438/303 |
| 6,884,719 | B2 | 4/2005 | Chang et al. |
| 6,887,521 | B2 * | 5/2005 | Basceri ................. 427/248.1 |
| 6,900,115 | B2 | 5/2005 | Todd |
| 6,905,547 | B1 * | 6/2005 | Londergan et al. ........... 118/715 |
| 6,921,702 | B2 * | 7/2005 | Ahn et al. .............. 438/287 |
| 6,932,871 | B2 | 8/2005 | Chang et al. |
| 6,958,253 | B2 | 10/2005 | Todd |
| 6,962,859 | B2 | 11/2005 | Todd et al. |
| 6,986,914 | B2 | 1/2006 | Elers et al. |
| 7,079,903 | B2 | 7/2006 | O'Brien |
| 7,081,271 | B2 | 7/2006 | Chung et al. |
| 7,087,497 | B2 | 8/2006 | Yuan et al. |
| 7,097,886 | B2 | 8/2006 | Moghadam et al. |
| 7,332,442 | B2 * | 2/2008 | Vaartstra et al. ............ 438/758 |
| 7,691,757 | B2 * | 4/2010 | Haukka et al. ............. 438/785 |
| 2001/0041250 | A1 | 11/2001 | Werkhoven et al. |
| 2001/0053615 | A1 | 12/2001 | Lim |
| 2003/0168001 | A1 * | 9/2003 | Sneh .................... 117/86 |
| 2005/0042373 | A1 | 2/2005 | Kraus et al. |
| 2005/0064684 | A1 | 3/2005 | Todd et al. |
| 2005/0070126 | A1 * | 3/2005 | Senzaki ................. 438/785 |
| 2005/0115275 | A1 * | 6/2005 | Kedem et al. ............. 63/32 |
| 2005/0118837 | A1 | 6/2005 | Todd et al. |
| 2005/0221006 | A1 * | 10/2005 | Vaartstra ................. 427/248.1 |
| 2005/0239297 | A1 * | 10/2005 | Senzaki et al. ............ 438/785 |
| 2005/0250302 | A1 | 11/2005 | Todd et al. |
| 2005/0255713 | A1 | 11/2005 | Taguchi et al. |
| 2006/0060137 | A1 | 3/2006 | Hasper et al. |
| 2006/0199357 | A1 | 9/2006 | Wan et al. |
| 2007/0026621 | A1 | 2/2007 | Cho et al. |
| 2007/0116888 | A1 | 5/2007 | Faguet |
| 2007/0210702 | A1 | 9/2007 | Nakamura |
| 2007/0212859 | A1 * | 9/2007 | Carey et al. ............. 438/487 |
| 2007/0218623 | A1 * | 9/2007 | Chua et al. ............. 438/240 |
| 2008/0003838 | A1 | 1/2008 | Haukka et al. |
| 2009/0155486 | A1 * | 6/2009 | Bhat et al. ............. 427/534 |

FOREIGN PATENT DOCUMENTS

| | | | |
|---|---|---|---|
| JP | 8 264 530 | | 10/1996 |
| WO | WO 00/47404 | | 8/2000 |
| WO | WO 00/54320 | | 9/2000 |
| WO | WO 01/27347 | | 4/2001 |
| WO | WO 01/29280 | | 4/2001 |
| WO | WO 01/29893 | | 4/2001 |
| WO | WO 01/53565 | | 7/2001 |
| WO | WO 2004-010469 | * | 1/2004 |
| WO | WO 2007/041124 | | 4/2007 |

OTHER PUBLICATIONS

Schumacher, M., et al., "MOCVD for complex multicomponent thin films—a leading edge technology for next generation devices." Materials Science in Semiconductor Processing 5 (2003) pp. 85-91.*

Li, Huazhi, et al., "Vapor Deposition of Ruthenium from an Amidinate Precursor". Journal of The Electrochemical Society, 154 (12), D642-D647 (2007).*

Vidjayacoumar, Balamurugan, et al., "Investigation of AIM3, BEt3, and ZnEt2 as Co-Reagents for Low-Temperature Copper Metal ALD/Pulsed-CVD". Chem. Mater. 2010, 22, pp. 4844-4853.*

Andricacos, et al., "Damascene copper electroplating for chip," *IBM Jour. Research and Dev.*, 42:567 (1998).

Elers, et al., "NbCl5 as a precursor in atomic layer epitaxy," *Applied Surface Science*, 82/83:468-474 (1994).

Engbrecht, E.R., et al., "Chemical Vapor Deposition Growth and Properties of TaCxNy." Thin Solid Films 418 (2002) pp. 145-150.

Hiltunen, et al., "Nitrides to titanium, niobium, tantalum and molybdenum grown as thin films by the atomic layer epitaxy method," *Thin Solid Films*, 166:149-154 (1988).

Klaus, J.W., et al., "Atomically controlled growth of tungsten and tungsten nitride using sequential surface reactions," *Appl. Surf. Science* 162-163; 479-471 (2000).

Klaus, J.W., et al., "Atomic layer deposition of tungsten nitride films using sequential surface reactions," *Journal of the Electrochemical Soc.*, 147 (3):1175-1181 (2000).

Klaus, J.W., et al., "Atomic layer deposition of tungsten using sequential surface chemistry with a sacrificial stripping reaction," *Thin Solid Films*, 360:145-153 (2000)n.

Leskela, et al., "ALD precursor chemistry: Evolution and future challenges," *Jour. Phys. IV France* 9, 837-852 (1999).

Ritala, et al., "Effects of intermediate zinc pulses on properties of TiN and NbN films deposited by atomic layer epitaxy," *Appl. Surf. Sci.*, 120:199-212 (1997).

Ritala, et al., "Perfectly conformal TiN and Al2O3 films deposited by atomic layer deposition," *Chem. Vapor Deposition*, 5:7-9 (1999).

Ryu, et al., "Barriers for copper interconnections," *Solid State Technology*, Apr., 53 (1999).

Song, Moon-Kyun, et al., "Phase Formation in the Tantalum Carbonitride Film Deposition with Atomic Layer Deposition Using Ammonia." Journal of te Electrochemical Society 155 (10) H823-H828, 2008.

Wang, Shui Jinn, et al., "Influence of Nitrogen Doping on the Barrier Properties of Sputtered Tantalum Carbide Films for Copper Metallization." Jpn. J. Appl. Phys. vol. 40 (2001), pp. 6212-6220.

* cited by examiner

METHOD FOR DEPOSITING THIN FILMS BY MIXED PULSED CVD AND ALD

REFERENCE TO RELATED APPLICATION

This application is related to U.S. patent application Ser. No. 11/766,367 (now U.S. Pat. No. 7,638,170) to Wei-Min Li, filed Jun. 21, 2007, entitled LOW RESISTIVITY METAL CARBONITRIDE THIN FILM DEPOSITION BY ATOMIC LAYER DEPOSITION, the entire disclosure of which is incorporated by reference herein.

FIELD OF THE INVENTION

The invention relates generally to semiconductor fabrication and, more particularly, to the deposition of thin films onto a substrate by exposing the substrate to mutually reactive reactants in a pulse-wise manner.

BACKGROUND AND SUMMARY OF THE INVENTION

ALD, in which temporally alternating and sequential reactant pulses of reactants are flowed into a reaction chamber, can be used to form multicomponent films, that is, films composed of thinner constituent films which have different compositions, and in which the thinner films are preferably vertically stacked in a repeating, regular sequence. By selecting the sequence and number of cycles, it has been believed that the film composition can easily be tailored in depositions using ALD.

HfSiO films are a type of film which can be grown using various ALD sequences, with $HfCl_4$, $SiCl_4$ and $H_2O$ used as precursors. For example, pulses of $H_2O$ flowing into a reaction chamber can be used to separate pulses of $HfCl_4$ or $SiCl_4$, e.g., in one cycle, a $HfCl_4$ pulse can be followed by a $H_2O$ pulse, which is followed by a $SiCl_4$ pulse, which is followed by a $H_2O$ pulse. The cycles can be repeated to form a film of a desired thickness.

However, it has been found that ALD can have difficulties forming films having some desired compositions. For example, it has been found that ALD has difficulties forming HfSiO films that are silicon oxide rich. Increasing the amount of silicon oxide by increasing the number of $SiCl_4/H_2O$ cycles was found to have little impact on the quantity of deposited silicon oxide. After an initial cycle of $SiCl_4$ followed by $H_2O$, additional and subsequent $SiCl_4/H_2O$ cycles were found to result in limited additional deposition. Without being limited by theory, the $SiO_2$ deposition process by ALD is believed to be poisoned by the additional $SiCl_4/H_2O$ cycles. It was found that a cycle of $HfCl_4$ followed by $H_2O$ was needed before further $SiO_2$ could be deposited. Moreover, attempting to increase the amount of silicon in the HfSiO film by extending the length of the $SiCl_4$ pulses had little effect. Thus, these difficulties place severe constraints on the silicon concentrations that can be achieved in HfSiO films that are deposited by ALD.

In another example, when growing HfSiON films using $HfCl_4$, $SiCl_4$, $NH_3$ and $H_2O$ as precursors in various ALD sequences, it was difficult to achieve nitrogen concentrations of 3 atomic % or higher. Without being limited by theory, it is believed that the nitride deposition utilizes a less effective chemistry than the deposition of the other film materials, thereby limiting the nitrogen concentration, since less material is deposited by this chemistry. It is also believed that nitrogen on the surface of the deposited film may be replaced by oxygen when exposed to the oxidant pulse, thereby further diminishing the nitrogen concentration. Whatever the mechanism, depending upon the chemistry and the desired deposited film, ALD has been found to have significant limitations, especially for forming multicomponent films.

In some applications, CVD provides an alternative deposition scheme. For some chemistries and types of films, however, e.g., oxide chemistries employing the hydrolysis of halides to form oxide films, CVD is expected to result in overly aggressive gas phase reactions and ALD is the preferred method of deposition. Thus, while ALD has been found to have limited ability to tailor compositions in some applications, such as in the formation of HfSiO or HfSiON films, CVD is also expected to have limited compatibility with the depositions of these films, due to overly strong gas phase hydrolysis reactions.

Moreover, it has been found that, while some chemistries are compatible with both CVD and ALD, many chemistries are more suitable for only CVD or ALD. In some cases, this can limit the combination of chemistries that can be selected for the deposition of multicomponent films. For example, depending on the materials constituting the film to be formed, all the chemistries used in the deposition of the film may need to be compatible with ALD processing or all the chemistries may need to be compatible with CVD processing. In other situations, it has been found that available chemistries may be suitable for either CVD or ALD, but some advantages can be achieved using an ALD mode of operation and other advantages can be achieved with a CVD mode of operation.

Advantageously, preferred embodiments of the invention provide a solution that overcomes the problems noted above and that provides a method that combines the advantages of an ALD mode of operation and a CVD mode of operation. For example, preferred embodiments allow the formation of multicomponent films, such as HfSiON films, with elemental concentrations which can be tailored, as desired. Moreover, using ALD and CVD-type processing allows chemistries with disparate reactivities to be combined. For example, the high reactivity of highly reactive chemistries can be controlled by using the chemistries in an ALD-type deposition, while the moderate reactivity of moderately reactive chemistries can be advantageously applied in a CVD-type deposition, which allows for increased deposition rates.

In an embodiment of the invention, a method for the deposition of multi-component thin films on a substrate in a reaction chamber is provided. The method comprises depositing a first component of the film by flowing pulses of a first and second reactant into the reaction chamber in an Atomic Layer Deposition (ALD) pattern of sequential, alternating and self limiting pulses and depositing a second component of the film by flowing a third reactant and a fourth reactant into a reactor in a pattern corresponding to a pulsed CVD pattern wherein pulses of the third reactant are flown into the reaction chamber during flowing of the fourth reactant into the reaction chamber. It will be appreciated that the terms "first," "second," "third," and "fourth" are used for ease of description and do not necessarily indicate the order or identity of a reactant. For example, each of these reactants may be different, or one or more of these reactants may be the same.

In another embodiment of the invention, a method for depositing a film on a substrate is provided. The method comprises exposing the substrate to alternating and sequential reactant pulses of at least two mutually reactive reactants in an ALD mode of operation during a period A and exposing the substrate to one or more pulses of a reactant while exposing the substrate to another reactant in a pulsed CVD mode of operation during a period B, wherein the two reactants are mutually reactive.

In yet another embodiment of the invention, a method for depositing a multi-component thin film on a substrate in a reaction chamber is provided. The method comprises depositing a first component of the film on the substrate by flowing a first and second reactant into the reaction chamber in sequential and alternating pulses during a period A. The first and second reactants deposit self-limitedly on the substrate. A second component of the film is deposited on the first component by flowing a third reactant into the reaction chamber while simultaneously flowing a fourth reactant into the reaction chamber during a period B. The third and fourth reactants are mutually reactive. A total exposure time of the substrate to the fourth reactant during the period B is longer than a total exposure time of the substrate to the third reactant during the period B.

In another embodiment of the invention, a method is provided for depositing a film on a substrate. The method comprises exposing the substrate to temporally separated pulses of at least two mutually reactive reactants during a period A to deposit a compound comprising elements of the at least two mutually reactive reactants. About a monolayer or less of material is deposited per pulse. The substrate is exposed to one or more pulses of a third reactant while exposing the substrate to a fourth reactant during a period B. The third and fourth reactants are mutually reactive An interval between each of the pulses of the third reactant is at least about 1.75 times a duration of an immediately preceding pulse of the third reactant.

In yet another embodiment of the invention, a method is provided for depositing a metal compound film on a substrate. The method comprises exposing the substrate to one or more pulses of a metal source reactant while exposing the substrate to a first reactant reactive with the metal source reactant, thereby forming a film comprising a metal compound during a period A. Less than about 8 monolayers of the metal compound are deposited per pulse of the metal source reactant. The substrate is exposed to pulses of a second reactant reactive with the metal compound film during a period B. The substrate is not exposed to a metal precursor during the period B.

DETAILED DESCRIPTION OF THE PREFERRED EMBODIMENTS

Figure 1:
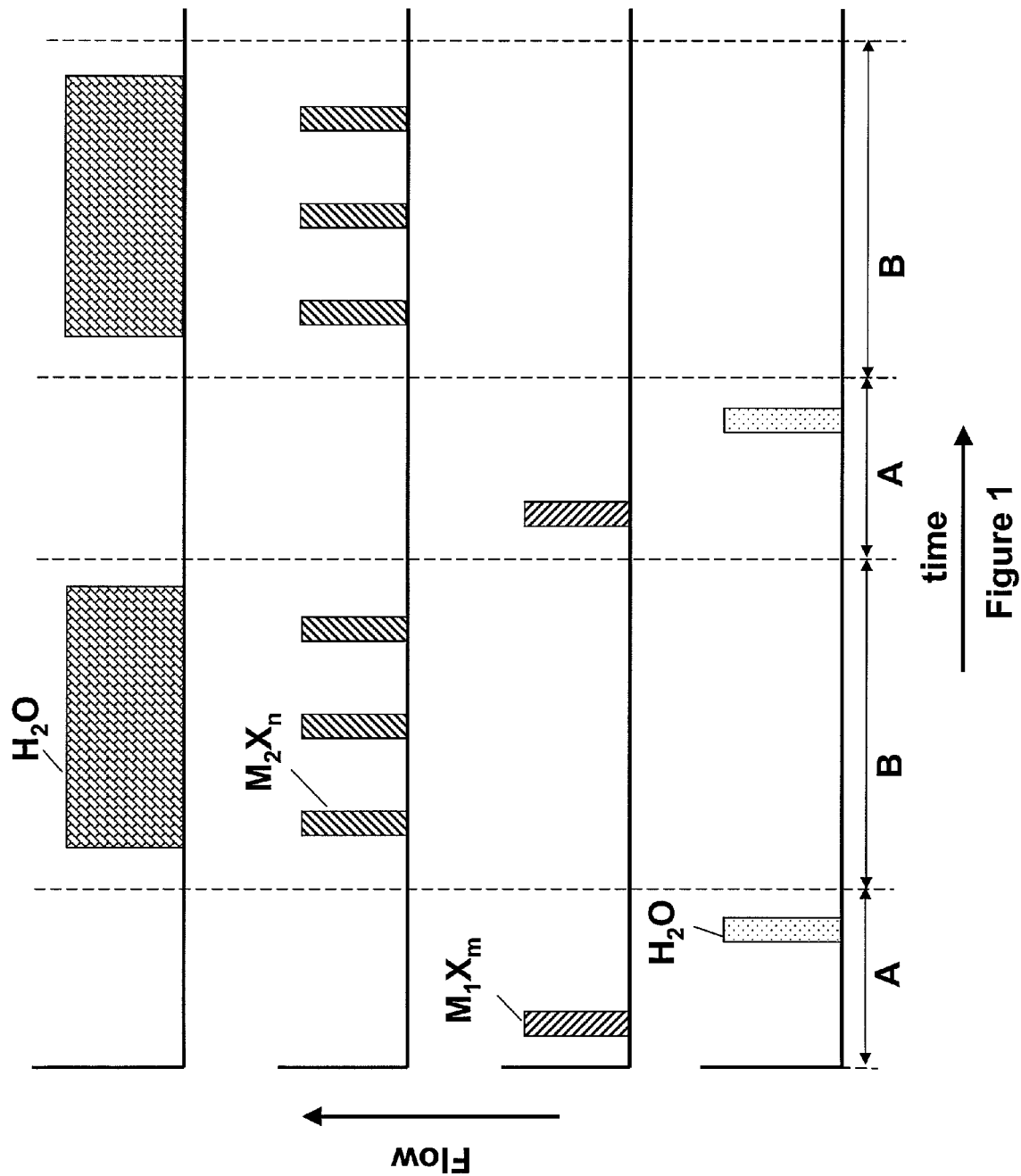
FIG. 1 is a reactant pulse sequencing scheme according to some preferred embodiments of the invention.

Preferred embodiments of the invention provide a method for the deposition of thin films on substrates, such as semiconductor wafers. Reactants, or precursors, are fed into a reaction chamber in a pulse-wise pattern over time, with one period or phase of the pulse pattern corresponding to an ALD-type of pulsing in which sequential, alternating pulses of precursors are flowed into the reaction chamber to self-limitingly deposit on a substrate and another period or phase of the pulse pattern corresponding to a CVD-type of pulsing in which two mutually reactive precursors are flowed into the reaction chamber simultaneously. Preferably, the CVD process is a pulsed CVD process, in which reactants are introduced into the reaction chamber in pulses, with at least part of the pulses overlapping temporally. Preferably, the durations of the pulses of the precursors into the reaction chamber correspond to the durations that a substrate in the reaction chamber is exposed to the precursors. The combination of the ALD and CVD pulse patterns constitute a cycle, which can be repeated as desired, e.g., until a film of a desired thickness is formed.

In preferred embodiments, the durations of exposure to the different precursors during the CVD phase of the deposition are unequal: the substrate is exposed to one of the precursors for a longer duration than the other precursor. For example, in some embodiments, the CVD pulse pattern can include more pulses of one precursor than the other. In other embodiments, the average duration of the pulses of one of the precursors can be longer than the average duration of the pulses of the other of the precursors. In yet other embodiments, one precursor can be flowed continuously while the other precursor is pulsed. It will be appreciated that combinations of these pulse patterns are also possible.

Advantageously, the unequal pulse durations allow improved deposition results. It will be appreciated that some ligand containing precursors, such as metal halides, can deposit at a faster rate than the rate of ligand removal by nitridation or oxidation. As a result, a longer exposure time to a nitrogen or oxygen precursor is advantageous for complete nitridation or oxidation of the deposited metal, thereby more completely removing any residual ligands from the deposited metal and forming high quality metal nitrides or metal oxides.

In some preferred embodiments, the combination of precursors for the ALD pulse patterns are different from the combination of precursors for the CVD pulse patterns, thereby allowing the formation of multicomponent films or nanolaminate films in some embodiments. In some embodiments, the ALD and CVD pulse patterns can have a common precursor, while a precursor present in the ALD pulse pattern may be absent from the CVD pulse pattern and/or vice versa. In other embodiments, the precursors used in each of the ALD and CVD pulse patterns are the same.

It will be appreciated that the some mutually-reactive precursors can react aggressively to deposit layers of poor quality. For example, the hydrolysis of halides to form oxide films is a very aggressive gas phase reaction which is difficult to control. Instead of CVD, ALD can advantageously be applied to form layers for which aggressive reactions, such as the hydrolysis of halides, would otherwise be encountered if CVD were utilized.

In will also be appreciated that, although ALD provides advantages for film uniformity and general quality of the film, pulsed CVD has the advantage of a higher deposition rate while preserving many of the advantages of ALD. With some chemistries, hardly any film is deposited in ALD, so that ALD is impractical as a deposition method for those films and pulsed CVD advantageously allows higher deposition rates and, ultimately, higher throughput. For example, in the deposition of TiN from $TiCl_4$ and $NH_3$ it was found that flowing pulses of $TiCl_4$ in a continuous flow of $NH_3$ provides films with an excellent quality and deposition at a substantially higher deposition rate than with ALD. Such a deposition is discussed in commonly owned U.S. patent application Ser. No. 11/096,861, filed Mar. 31, 2005, the entire disclosure of which is incorporated herein by reference. Thus, pulsed CVD can be utilized with reactants for which relatively moderate gas phase reactions occur, thereby advantageously allowing a higher throughput per cycle than would be expected from processing by only ALD.

Advantageously, the preferred embodiments allow the advantages of an ALD mode of operation to be combined with the advantages of a CVD mode of operation. For example, highly reactive chemistries can be combined with moderate or low reactivity chemistries by using ALD for the highly reactive chemistries and using CVD for the less reactive chemistries. Advantageously, nano-laminate films, in which different materials are deposited during ALD and CVD periods of a deposition, can be formed, even using combinations of highly reactive and less reactive chemistries.

Preferably, reactants are removed from the reaction chamber after each of the ALD and CVD phases and the reaction chamber is maintained at an elevated temperature. For example, the reactants can be purged and/or evacuated from the reaction chamber. Preferably, the purge and/or evacuation period is sufficiently long to allow ligands to be removed or to escape from the deposited film, which can have advantages for improving film properties, especially in CVD, in which the ligand is not desired to be part of the deposited film. For example, in some applications where the ligand is chlorine, the removal of residual chlorine has been found to advantageously reduce film resistivity. Preferably, to facilitate removal of residual ligands, the duration of ligand removal is about 1.5 times or more and, most preferably, about 2 times or more longer than the duration of the pulse of the ligand-containing precursor. In the ligand removal period, it will be appreciated that ligands can be removed by exposing the substrate to a reactant which reacts with a deposited film to displace ligands in the deposited film. In addition, to prevent trapping the ligands in the deposited film, the CVD phase deposits about 8 monolayers or less of material and, more preferably, about 5 monolayers or less of material per CVD phase.

As an example, the removal of ligands has been found to improve film properties in the deposition of TiN from $TiCl_4$ and $NH_3$. TiN can be deposited using a pulse sequence in which the pulses of the two reactants are of unequal length or in which the exposure times of the substrate to a first and second reactant during one cycle are unequal. For example, in one scheme, only one reactant is pulsed whereas the other is continuously flowed into the reaction chamber, so that it is flowed into the chamber between and during the pulses of the other reactant. This scheme was found to be particularly advantageous; flowing pulses of $TiCl_4$ in a continuous flow of $NH_3$ provides films with an excellent quality and deposition at a substantially higher deposition rate than with ALD. In a particularly advantageous pulse sequence, $NH_3$ is flowed continuously, the length of the $TiCl_4$ pulses is such that not more than 5 monolayers of TiN are deposited per pulse and the interval between the successive $TiCl_4$ pulses is of equal length or larger than the length of the $TiCl_4$ pulses. Preferably, the interval between successive $TiCl_4$ pulses is at least about 1.75 times or more and, more preferably, about two times or more the length of the $TiCl_4$ pulses. Under such circumstances, residual chlorine is allowed to escape from the deposited film in an annealing period during the intervals in between the $TiCl_4$ pulses, when the $NH_3$ is still flowing. This results in a reduction in film resistivity, relative to depositions which do not allow the removal of residual chlorine. When more than 5 monolayers of TiN film are deposited per $TiCl_4$ pulse, the chlorine gets trapped into the film and when the intervals between the $TiCl_4$ pulses are too short, the chlorine does not have sufficient time to escape from the film. Using this pulsed CVD process, the quality of the deposited films resemble those of ALD films and are highly improved as compared to films deposited by regular CVD in which a substrate is only exposed to two reactant flows or pulses that are substantially synchronous. In alternative embodiments, the $NH_3$ flow can also be pulse-wise, but the $NH_3$ pulses have a longer duration than the $TiCl_4$ pulses and the $TiCl_4$ pulses occur during the $NH_3$ pulses. In other embodiments, for each cycle, at least one $NH_3$ pulse substantially completely overlaps temporally with a $TiCl_4$ pulse, and at least one additional $NH_3$ pulse is utilized, without an additional $TiCl_4$ pulse, so that the total duration of exposure to $NH_3$ is greater than the duration of exposure to $TiCl_4$.

Reference will now be made to the Figures. Examples of pulse patterns according to exemplary embodiments of the invention are shown in FIGS. 1-5.

In FIG. 1, pulses of a first metal halide ($M_1X_m$) and an oxidant (e.g., $H_2O$) are flowed into the reaction chamber in sequential and alternating pulses in an ALD mode of operation during a period of time A (period A). The gas flow sequence of period A can be repeated one or more times (p times). Then, multiple pulses of a second metal halide ($M_2X_n$) are applied during a long single oxidant pulse (e.g., $H_2O$ pulse) in a pulsed CVD mode of operation during a period of time (period B). As used herein, the identifiers $M_1X_m$ and $M_2X_n$ are used for ease of description in discussing the metal halides used during different periods. No composition or ratios for constituent elements are implied by the use of the letters M and X, or the subscripts 1, 2, m and n.

With continued reference to FIG. 1, although three pulses of the second metal halide are shown during period B, the number of pulses applied can be at least one and up to any number, depending on the desired composition of the film. After termination of the second metal halide pulses and the long oxidant pulse, the sequence of period A can be repeated again. Then the entire sequence, constituting one cycle, can be repeated one or more time (q times) until the desired film thickness is achieved. As used herein, the sequence can be represented as q[(p*A)+B], with A and B signifying the sequences performed during periods A and B, p signifying the number of times the sequence of period A is performed, and q signifying the number of times that an entire cycle, including all sequences A and B, is performed.

Although in the example of FIG. 1, $H_2O$ is shown as the preferred oxidant, other oxidants or combinations of oxidants can also be used. The pulsed CVD mode of operation is particularly beneficial when the second metal halide is a silicon halide. As discussed herein, the time spans between the pulses of the metal halide advantageously allow residual halide to be removed from the deposited film, thereby improving film properties.

Figure 2:
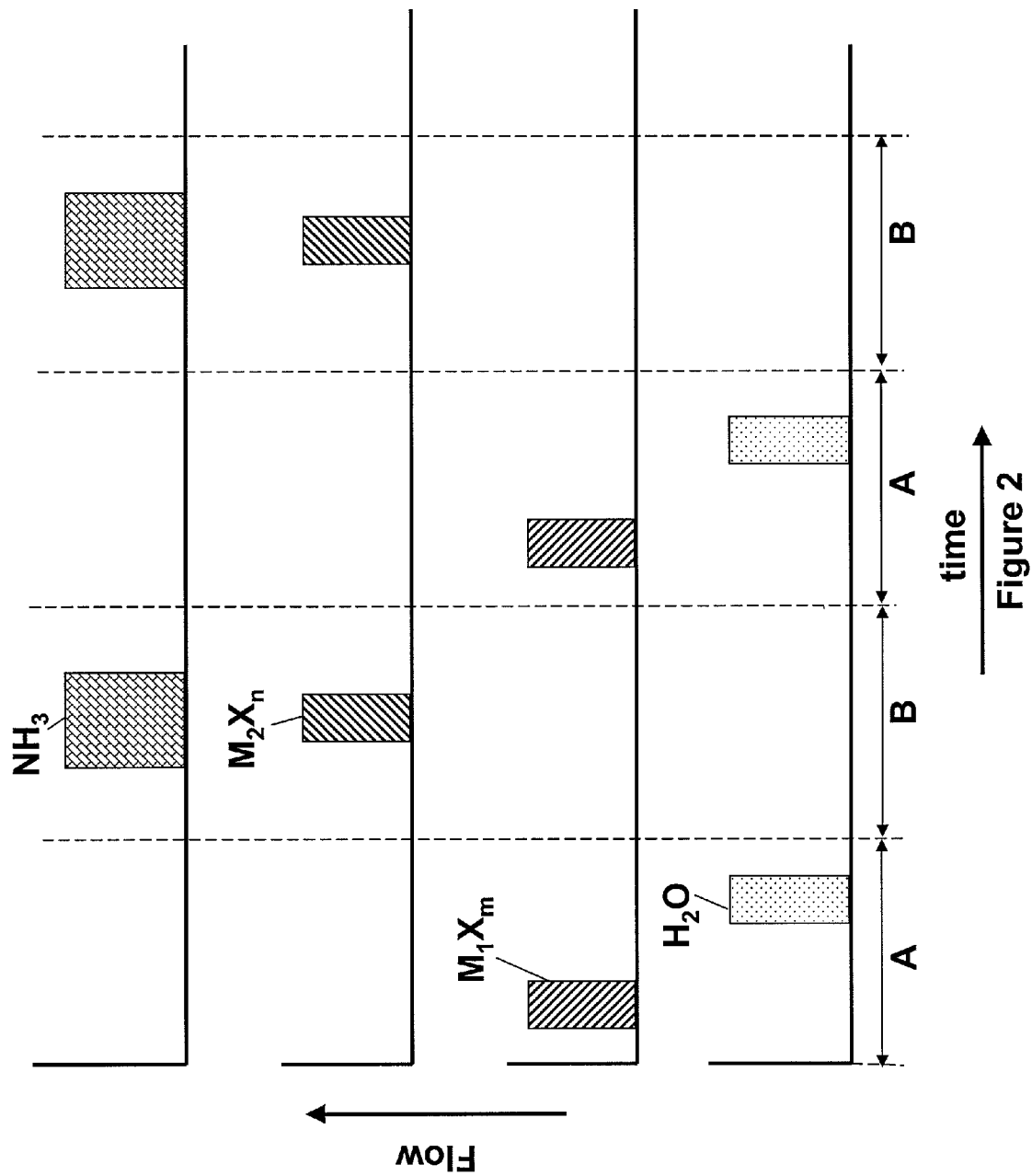
FIG. 2 is another reactant pulse sequencing scheme according to other preferred embodiments of the invention.

In FIG. 2, pulses of a first metal halide ($M_1X_m$) and an oxidant (e.g., $H_2O$) are flown into the reaction chamber in a sequential and alternating way in an ALD mode of operation during a period of time A. The pulse sequence shown in period A can be repeated p times. Then a period of time B follows in which pulses of a second metal halide ($M_2X_n$) and a nitrogen precursor (e.g., $NH_3$) are flowed simultaneously into the reactor in a pulsed CVD mode of operation. As the period B of the process is alternated with a period A having an ALD mode of operation, the nitrogen precursor flow during period B is also periodical, or "pulse-wise," but with a longer pulse duration than the duration of the metal halide pulses. In the example shown, the nitrogen precursor pulse starts before the start of the second metal halide pulse and stops some time after the termination of the second metal halide pulse. The sequence of p*A+B can be repeated q times until the desired film thickness is achieved. In cases where a thicker nitride film is needed, the cycle of period B can be repeated before switching to the cycle of period A again. In addition, to grow a thicker nitride film, it may also be possible to extend the pulse durations of the second metal halide and the nitrogen precursor pulses or to apply multiple second metal halide pulses during a long nitrogen precursor pulse, such as in accordance with the sequence shown in FIG. 3.

Figure 3:
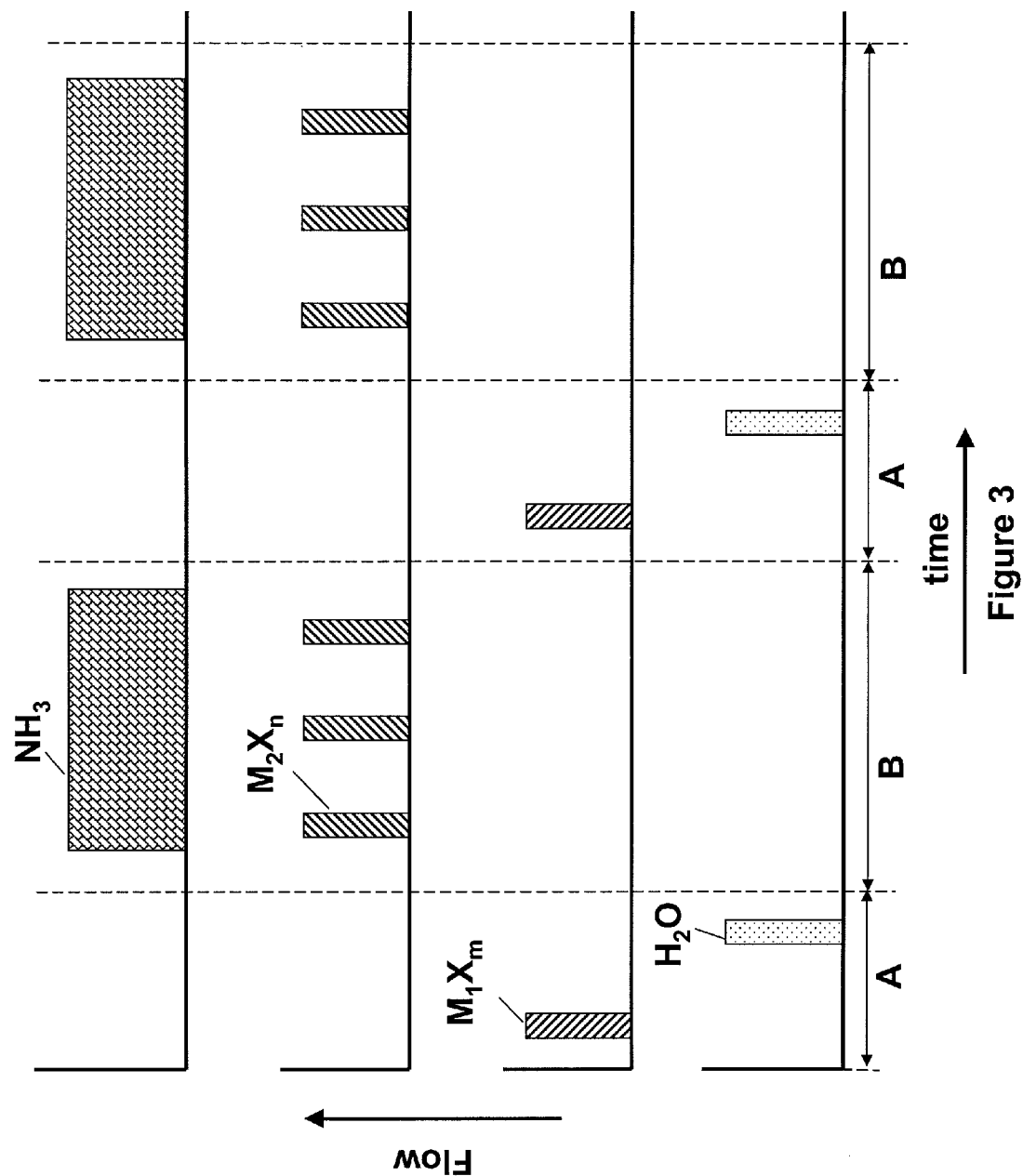
FIG. 3 is yet another reactant pulse sequencing scheme according to yet other preferred embodiments of the invention.

In FIG. 3, pulses of a first metal halide ($M_1X_m$) and an oxidant (e.g., $H_2O$) are flowed into the reaction chamber in a sequential and alternating way in an ALD mode of operation during a period of time A. The sequence of period A can be repeated p times. Then, multiple pulses of a second metal halide ($M_2X_n$) are applied during a long single nitrogen precursor pulse (e.g., a $NH_3$ pulse) in a pulsed CVD period B. Although three pulses of the second metal halide are shown during period B in FIG. 3, the number of pulses applied can be at least one and up to any number, depending on the desired composition of the film. After termination of the second metal halide pulses and the long $NH_3$ pulse, the sequence of period A can be repeated again. Then the sequence p*A+B can be repeated q times until the desired film thickness is achieved.

Figure 4:
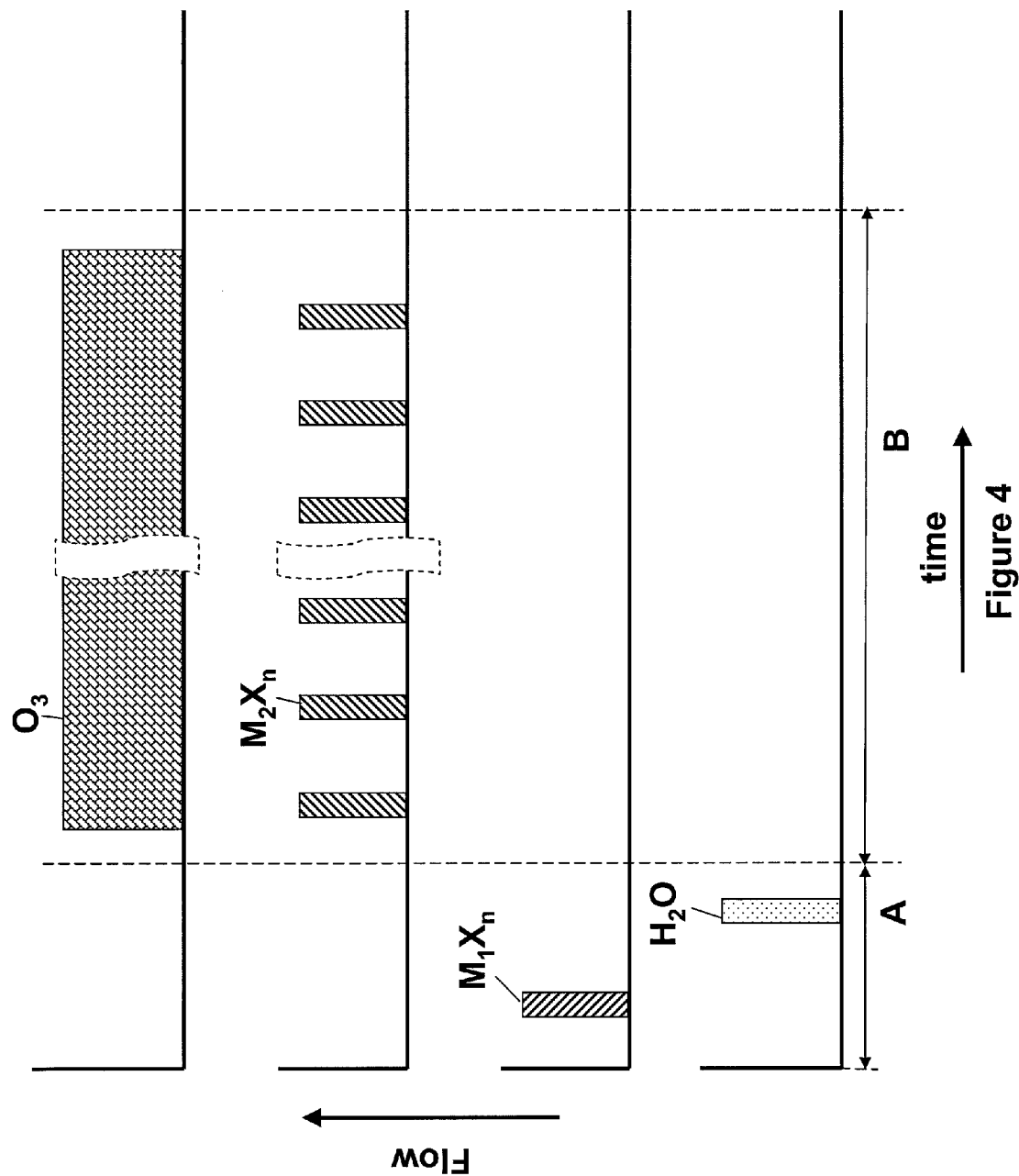
FIG. 4 is another reactant pulse sequencing scheme according to further preferred embodiments of the invention.

In FIG. 4, a deposition process sequence is shown with a period A during which a first metal halide ($M_1X_m$) and an oxidant (e.g., $H_2O$) are pulsed in a sequential alternating ALD mode of operation to deposit a nucleation layer. The sequence shown in period A can be repeated p times until an adequate nucleation layer is achieved. In some embodiments, for forming the nucleation layer, p can be between about 1 and about 100. Then pulses of a second metal halide ($M_2X_n$) are flown into the reactor during flowing an oxidant (e.g., $O_3$, ozone), which may be different from the oxidant used in period A, into the reactor during a period B. If the ALD mode of processing during period A only serves to provide a nucleation layer for the subsequent layer deposited by pulsed CVD during the period B, no repeating sequence of the A and B periods is needed and period B can be performed for a sufficiently long duration for the desired film thickness to be achieved in one period B.

Figure 5:
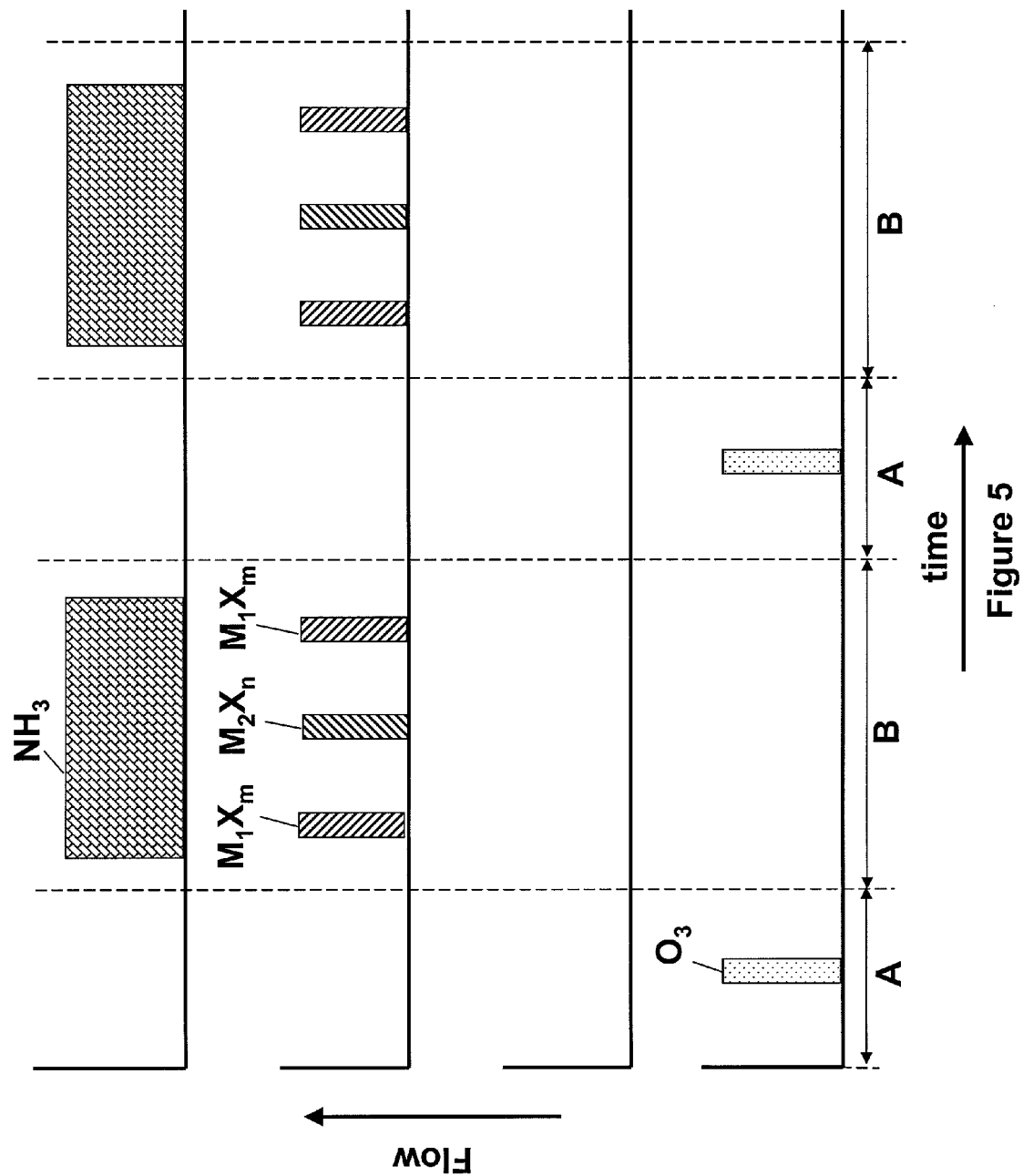
FIG. 5 is yet another reactant pulse sequencing scheme according to other preferred embodiments of the invention.

In FIG. 5, an embodiment is shown in which a metal nitride is deposited using a pulsed CVD sequence during a period B. Alternating pulses of a first and a second metal halide ($M_1X_m$ and $M_2X_n$, respectively) are applied during a flow of a nitrogen precursor (e.g., $NH_3$). The pulsed CVD period B is alternated with a period A in which a pulse of another reactant, preferably an oxidant, preferably $O_3$, is flowed into the reaction chamber while no other reactants are flowing. The sequence of pulses of first and second metal halides applied during the pulsed CVD method can be adapted to achieve a desired composition and/or thickness. For example, in some embodiments, only pulses of one metal halide are applied to form a layer in which that metal is the only metal in the layer.

It will be appreciated that other pulse patterns can be applied. For example, in some embodiments, more than two metal source materials can be flown into the reaction chamber. In other embodiments, a first metal source material can be mixed with a second metal source material and pulses of the mixture can be flown to the reaction chamber. The pulse patterns of one or the other of the periods A and B of the illustrated embodiments can also be repeated one or more times before performing the pulse pattern of the other of the periods A and B.

In addition, pulses of purge gas can be applied in between the pulses of reactants to purge the reaction chamber. Alternatively, a continuous flow of purge gas can be applied during the entire process. In addition, evacuation instead of, or in addition to purging, can be used to remove gases from the reaction chamber between pulses or periods.

The metals can comprise any metal or semiconductor of the periodic table. Although metal halides are given as an example in the figures, metal organic compounds may also be used in some embodiments. The first metal and the second metal precursors, or metal source materials, can be different metals, but may also be the same metal in some embodiments. In addition, in some embodiments, during the pulsed CVD periods illustrated in FIGS. 1-5, an oxidant, instead of a nitrogen precursor, or vice versa, can be applied to react with the metal source material.

It will be appreciated that preferred embodiments of the invention are particularly advantageous for the deposition of nano-laminate films. The variable p, the number of ALD cycles during period A and the number of second metal halide precursors during the pulsed CVD period B can be selected to form a nano-laminate film with any combination of thicknesses of the constituent films being deposited.

Example 1

A hafnium silicate layer is deposited using pulses of $HfCl_4$, $SiCl_4$ and $H_2O$ as reactants at a temperature of about 350° C. The sequence as shown in FIG. 1 is applied, where $M_1X_m$, the first metal halide, is $HfCl_4$ and $M_2X_n$, the second metal halide, is $SiCl_4$. The number of $SiCl_4$ pulses is selected to achieve a desired silicon content.

Example 2

A hafnium silicon oxynitride layer is deposited using pulses of $HfCl_4$, $SiCl_4$, $NH_3$ and $H_2O$ as reactants. The sequence of FIG. 2 is applied, where $M_1X_m$, the first metal halide, is $HfCl_4$ and $M_2X_n$, the second metal halide, is $SiCl_4$. The length of the pulses in period B is tuned to achieve the desired silicon and nitrogen content. The deposition temperature is about 350° C.

Alternatively, $HfCl_4$ and $SiCl_4$ are mixed and pulses of the mixture are flowed into a reaction chamber with pulses of an oxidant in an ALD mode of operation during a period A and pulses of the mixture are flowed into the reaction chamber with $NH_3$ in a pulsed CVD mode of operation during a period B.

Example 3

Hafnium oxide layers are deposited using $HfCl_4$ as the Hf source material. The sequence of FIG. 3 is followed, wherein a first nucleation layer is deposited using $HfCl_4$ and $H_2O$ in an ALD mode of processing. Then the remainder of the film is deposited by flowing a plurality of pulses of $HfCl_4$ along with a continuous flow of $O_3$ into the reactor. In this example, the first and second metal are the same and are both Hf. The deposition of the hafnium oxide layers in the pulsed CVD mode of operation may be periodically alternated with one or more cycles of hafnium oxide deposited using the ALD mode of operation.

Example 4

Ru metal films are deposited using a Ruthenium cyclopentadienyl compound and air or oxygen as precursors. Preferred Ruthenium compounds include $Ru(EtCp)_2$, Ruthenium diethylcyclopentadienyl, and Ru(DMPD)(EtCp), where DMPD=2,4-dimethylpentadienyl and EtCp=ethylcyclopentadienyl. In a first period A, pulses of the ruthenium cyclopentadienyl compound are flowed to a reaction chamber simultaneously with a flow of air or oxygen, in a pulsed CVD mode of operation, to form a nucleation layer. Advantageously, nucleation of the Ru film has been found to proceed faster in the pulsed CVD mode of operation than in the ALD mode of operation. Then, in a following period B, pulses of the Ruthenium cyclopentadienyl compound and air are flowed into the reaction chamber in sequential, alternating pulses in an ALD mode of operation to improve the crystalline quality of the film. Then, the deposition of the film can be continued, as desired, either in an ALD mode of operation to achieve optimum step coverage or it can be continued in a pulsed CVD mode of operation to achieve a higher deposition rate. In another deposition scheme, the pulsed CVD of Ruthenium oxide can be alternated with some cycles of deposition in an ALD mode of operation at regular time intervals. The pulsed CVD serves to deposit the majority of the film with a relatively high deposition rate and the ALD serves to improve the quality of the film.

Another advantage of the pulsed CVD mode of operation is that it allows influencing the oxygen content of the film. Ruthenium oxide is a conductive oxide and for some applications it may be beneficial to have some oxygen incorporated into the film. ALD processes have been found to have difficulty incorporating oxygen into the deposited film.

Alternatively, a nucleation layer can be formed by an ALD process using $AlCl_3$ or Tri Methyl Aluminum (TMA) and $H_2O$ as source materials. Then the Ruthenium films can be formed by pulsed CVD, eventually periodically interrupted by some ALD cycles.

Example 5

Figure 6:
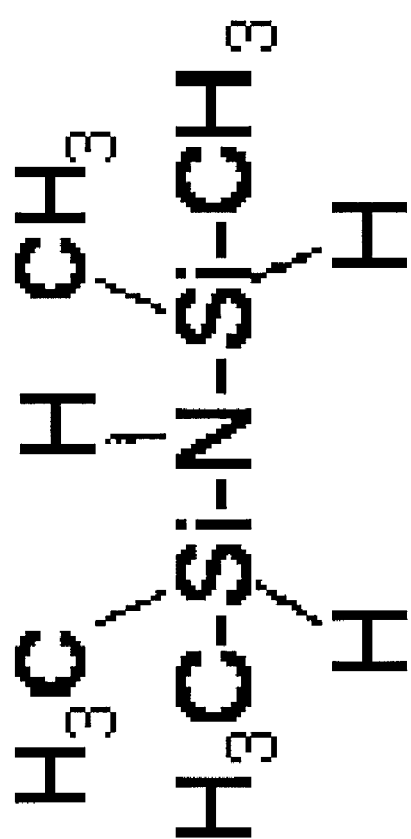
FIG. 6 shows a representation of the structure of a tetramethyl disilazane molecule.

A TaCN/TiN laminate film is deposited at a temperature of about 400° C., where the TaCN film is deposited by ALD and the TiN film is deposited by pulsed CVD. TiN films are used as conductors and diffusion barriers but they can easily oxidize or the surface under the TiN film can oxidize, since the columnar structure of TiN can serve as an oxygen diffusion path which allows oxygen to reach the surface. TaCN films can also oxidize, but due to the polycrystalline (microcrystallites) nature of the film, it does not provide any diffusion path for oxygen and can therefore advantageously protect the underlying TiN film. The TaCN films are deposited by sequential, alternating pulses of $TaF_5$ and TetraMethyl DiSilazane (TMDS, $HN(HSi(CH_3)_2)_2$) at a temperature of about 400° C. Silazanes are saturated silicon-nitrogen hydrides, having straight branched chains. They are analogous in structure to siloxanes with —NH— replacing —O—. The structure of TMDS is shown in FIG. 6. In addition to TMDS, other silazanes may also be used, e.g., a disilazane molecule having from 1 to 6 methyl groups attached to the silicon atoms or having 1 to 6 ethyl groups attached the silicon atoms, or a disilazane molecule having a combination of methyl and ethyl groups attached to the silicon atoms. Although the use of disilazanes is particularly advantageous because of their simplicity and high vapor pressure, in other embodiments, any silazane, e.g., trisilazanes can be used. The TaCN film can be used as a starting film, preventing the TiN from reacting with the underlying surface and/or protecting the underlying substrate from oxygen diffusion through the TiN film. Alternatively, a TaCN film can be used on top of the TiN film to protect it from oxidation by ambient oxygen. In other embodiments, TiCN films can be deposited alternating with the deposition of the TiN film so that a nano-laminate film is formed.

Example 6

A mixed nitride film is deposited comprising a metal and silicon. As the deposition of silicon nitride by ALD using a silicon halide or an alkylsilazane and $NH_3$ proceeds slowly, with limited deposited material per cycle, advantageously, a pulsed CVD method of operation is used for the silicon nitride deposition and an ALD method of operation is used for the metal nitride. A specific example is the deposition of AlSiN, using TMA, $SiCl_4$ and $NH_3$ at a temperature below about 350° C. to prevent decomposition of the TMA. Alternatively, $AlCl_3$ can be used as the aluminum source material in combination with $SiCl_4$ and $NH_3$. In that case, the choice of the deposition temperature is relatively free and temperatures between about 350 and about 600° C. can be used.

Example 7

In another example, a TiN film is deposited by a pulsed CVD process using $TiCl_4$ and $NH_3$ as source materials. The TiN film is improved by doping the film with silicon nitride. The silicon nitride film is deposited using ALD cycles of a silicon source and $NH_3$. The silicon source is preferably a silicon halide, more preferably, $SiCl_4$. In particular, if only slight doping is desired, an accurate dosing is possible by ALD and the combination of a pulsed CVD process for depositing the main constituent of the film and an ALD process for depositing the doping component of the film is advantageous. The process can be carried out at a temperature between about 300° C. and about 600° C. and preferably at a temperature of about 450° C. This use of a mixed pulsed CVD process and an ALD process for doping a film is not limited to the doping of TiN films but can be applied for the doping of any film.

Accordingly, it will be appreciated by those skilled in the art that various omissions, additions and modifications can be made to the processes described above without departing from the scope of the invention. All such modifications and changes are intended to fall within the scope of the invention, as defined by the appended claims.

We claim:

1. A method for depositing a multi-component thin film on a substrate in a reaction chamber, the method comprising:
   performing a plurality of deposition cycles, each cycle comprising:
      depositing a first component of the film on the substrate by flowing a first and second reactant into the reaction chamber in sequential and alternating pulses during a period A, the first and second reactants depositing self-limitedly on the substrate, wherein the first component is an oxide; and
      depositing a second component of the film by flowing a third reactant into the reaction chamber while simultaneously flowing a fourth reactant into the reaction chamber during a period B, wherein the third and fourth reactants are mutually reactive, wherein a total exposure time of the substrate to the fourth reactant during the period B is longer than a total exposure time of the substrate to the third reactant during the period B, and wherein the second component is a nitride.

2. The method of claim 1, wherein depositing the second component of the film comprises pulsing the third and fourth reactants into the reaction chamber during the period B.

3. The method of claim 2, wherein a total number of pulses of the fourth reactant is higher than a total number of pulses of the third reactant.

4. The method of claim 2, wherein a duration of each pulse of the fourth reactant is higher than a duration of each pulse of the third reactant so that each pulse of the third reactant is temporally entirely overlapped by a pulse of the fourth reactant.

5. The method of claim 1, wherein depositing the first component of the film comprises flowing a plurality of pulses of each of the first and the second reactants.

6. The method of claim 1, wherein the second reactant is an oxidant.

7. The method of claim 6, wherein the oxidant is selected from the group consisting of $O_2$, $O_3$ and $H_2O$.

8. The method of claim 7, wherein the fourth reactant is a nitrogen source.

9. The method of claim 8, wherein the nitrogen source is $NH_3$.

10. The method of claim 8, wherein the first and third reactants comprise a metal.

11. The method of claim 10, wherein the first and third reactants comprise different metals.

12. The method of claim 10, wherein the first and third reactants comprise a same metal.

13. The method of claim 10, wherein the first and third reactants are a metal halide.

14. The method of claim 8, wherein the first and third reactants are the same.

15. The method of claim 1, wherein depositing the first component of the film comprises forming a nucleation layer.

16. The method of claim 15, wherein depositing the second component of the film comprises depositing a same material as a material forming the nucleation layer.

17. The method of claim 1, wherein depositing the first component of the film is performed before depositing the second component of the film.

18. The method of claim 1, wherein flowing the first and the second reactant into the reaction chamber in sequential and alternating pulses during the period A constitutes an atomic layer deposition, wherein flowing the third reactant into the reaction chamber while simultaneously flowing the fourth reactant into the reaction chamber during the period B constitutes a pulsed chemical vapor deposition, wherein the pulsed chemical vapor deposition occurs before the atomic layer deposition.

19. The method of claim 1, wherein depositing the first component during a period A is repeated one or more times before depositing the second component during a period B.

20. The method of Claim 1, wherein performing the plurality of deposition cycles deposits a nitride film.

21. A method for depositing a film on a substrate, comprising:
    forming an oxide exposing the substrate to temporally separated pulses of at least two mutually reactive reactants during a period A to deposit a compound comprising elements of the at least two mutually reactive reactants, wherein about a monolayer or less of material is deposited per pulse;
    forming a nitride exposing the substrate to a plurality of pulses of a third reactant while exposing the substrate to a fourth reactant during a period B, wherein the third and fourth reactants are mutually reactive, and wherein an interval between each of the pulses of the third reactant is at least about 1.75 times a duration of an immediately preceding pulse of the third reactant; and
    repeating exposing the substrate to temporally separated pulses of at least two mutually reactive reactants during a period A and exposing the substrate to one or more pulses of a third reactant while exposing the substrate to a fourth reactant during a period B.

22. The method of claim 21, wherein the interval is at least about 2 times a duration of an immediately preceding pulse of the third reactant.

23. The method of claim 21, wherein exposing the substrate to temporally separated pulses of the at least two mutually reactive reactants comprises sequentially flowing each of the at least two mutually reactive reactants into a reaction chamber holding the substrate.

24. The method of claim 21, wherein a monolayer or more of material is deposited per pulse of the third reactant.

25. The method of claim 21, wherein the substrate is continuously exposed to the fourth reactant during the period B.

26. The method of claim 21, wherein exposing the substrate to one or more pulses of the third reactant while exposing the substrate to the fourth reactant comprises:
    simultaneously exposing the substrate to the third and the fourth reactants;
    subsequently removing reactant from a reaction chamber holding the substrate; and
    subsequently exposing the substrate to the fourth reactant.

27. The method of claim 26, wherein simultaneously exposing, subsequently removing and subsequently exposing constitute one cycle, wherein exposing the substrate to one or more pulses of the third reactant while exposing the substrate to the fourth reactant comprises performing more than one cycle.

28. The method of claim 27, wherein the substrate is exposed to one pulse of the third reactant per cycle.

29. The method of claim 28, wherein subsequently exposing comprises elevating a flow rate of the fourth reactant relative to a flow rate of the fourth reactant during simultaneously exposing.

30. The method of claim 26, wherein subsequently removing comprises purging or evacuating reactant from the reaction chamber.

31. The method of claim 26, wherein subsequently removing comprises purging and evacuating reactant from the reaction chamber.

32. The method of claim 26, further comprising removing reactant from the reaction chamber after subsequently exposing and before simultaneously exposing.

33. A method for depositing a metal compound film on a substrate, comprising:
    performing a plurality of deposition cycles, each cycle comprising:
        exposing the substrate to one or more pulses of a metal source reactant while exposing the substrate to a first reactant reactive with the metal source reactant, thereby forming a film comprising a metal compound during a period A, wherein less than about 8 monolayers of the metal compound are deposited per pulse of the metal source reactant; and
        exposing the substrate to pulses of a second reactant reactive with the metal compound film during a period B, wherein the substrate is not exposed to a metal precursor during the period B.

34. The method of claim 33, wherein less than about 5 monolayers of the metal compound are deposited per pulse of the metal source reactant.

35. The method of claim 33, further comprising exposing the substrate to one or more pulses of an other metal source reactant during the period A.

36. The method of claim 33, wherein the metal source reactant is a metal halide.

37. The method of claim 36, wherein the first reactant is a nitrogen precursor.

38. The method of claim 37, wherein the nitrogen precursor is ammonia.

39. The method of claim 36, wherein the second reactant is an oxygen precursor.

40. The method of claim 39, wherein the oxygen precursor is ozone.

* * * * *